United States Patent
Dubey et al.

(10) Patent No.: US 8,837,229 B1
(45) Date of Patent: Sep. 16, 2014

(54) CIRCUIT FOR GENERATING NEGATIVE BITLINE VOLTAGE

(71) Applicant: Synopsys, Inc., Mountain View, CA (US)

(72) Inventors: Prashant Dubey, Greater Noida (IN); Guarav Ahuja, New Delhi (IN); Sanjay Kumar Yadav, Greater Noida (IN); Amit Khanuja, New Delhi (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/958,284

(22) Filed: Aug. 2, 2013

Related U.S. Application Data

(60) Provisional application No. 61/798,055, filed on Mar. 15, 2013.

(51) Int. Cl.
  *G11C 7/00* (2006.01)
  *G11C 7/12* (2006.01)
  *H02M 3/07* (2006.01)
  *G11C 7/10* (2006.01)

(52) U.S. Cl.
  CPC . *G11C 7/12* (2013.01); *H02M 3/07* (2013.01); *G11C 7/1084* (2013.01); *G11C 7/1096* (2013.01)
  USPC .................. 365/189.02; 365/154; 365/189.11

(58) Field of Classification Search
  CPC ...... G11C 7/10; G11C 7/1051; G11C 7/1048; G11C 7/1078; G11C 7/1084; G11C 7/1096; G11C 7/12; H02M 3/07
  USPC .................... 365/189.02, 154, 189.11, 189.16
  See application file for complete search history.

(56) References Cited

U.S. PATENT DOCUMENTS

| | | | |
|---|---|---|---|
| 5,808,956 A * | 9/1998 | Maruyama | 365/230.06 |
| 6,501,307 B1 | 12/2002 | Yen | |
| 7,983,098 B2 * | 7/2011 | Passerini et al. | 365/189.11 |
| 2007/0081379 A1 * | 4/2007 | Clinton et al. | 365/149 |
| 2011/0012639 A1 | 1/2011 | Tamura | |
| 2011/0128056 A1 | 6/2011 | An | |
| 2011/0235420 A1 | 9/2011 | Sharon et al. | |
| 2012/0268983 A1 | 10/2012 | Muralimanohar et al. | |

OTHER PUBLICATIONS

PCT International Search Report and Written Opinion, PCT Application No. PCT/US13/74480, Jun. 5, 2014, 16 pages.

* cited by examiner

*Primary Examiner* — Tan T. Nguyen
(74) *Attorney, Agent, or Firm* — Fenwick & West LLP

(57) ABSTRACT

An integrated circuit for generating a negative bitline voltage comprises a bitline connectable to a memory cell and a multitude of capacitors arranged in groups thereof connected to the bitline. A step signal generator can generate a consecutive sequence of step signals to be applied to a group of capacitors. The circuit may be part of an integrated memory circuit device to drive the bitline to a negative voltage to implement a write assist scheme.

20 Claims, 9 Drawing Sheets

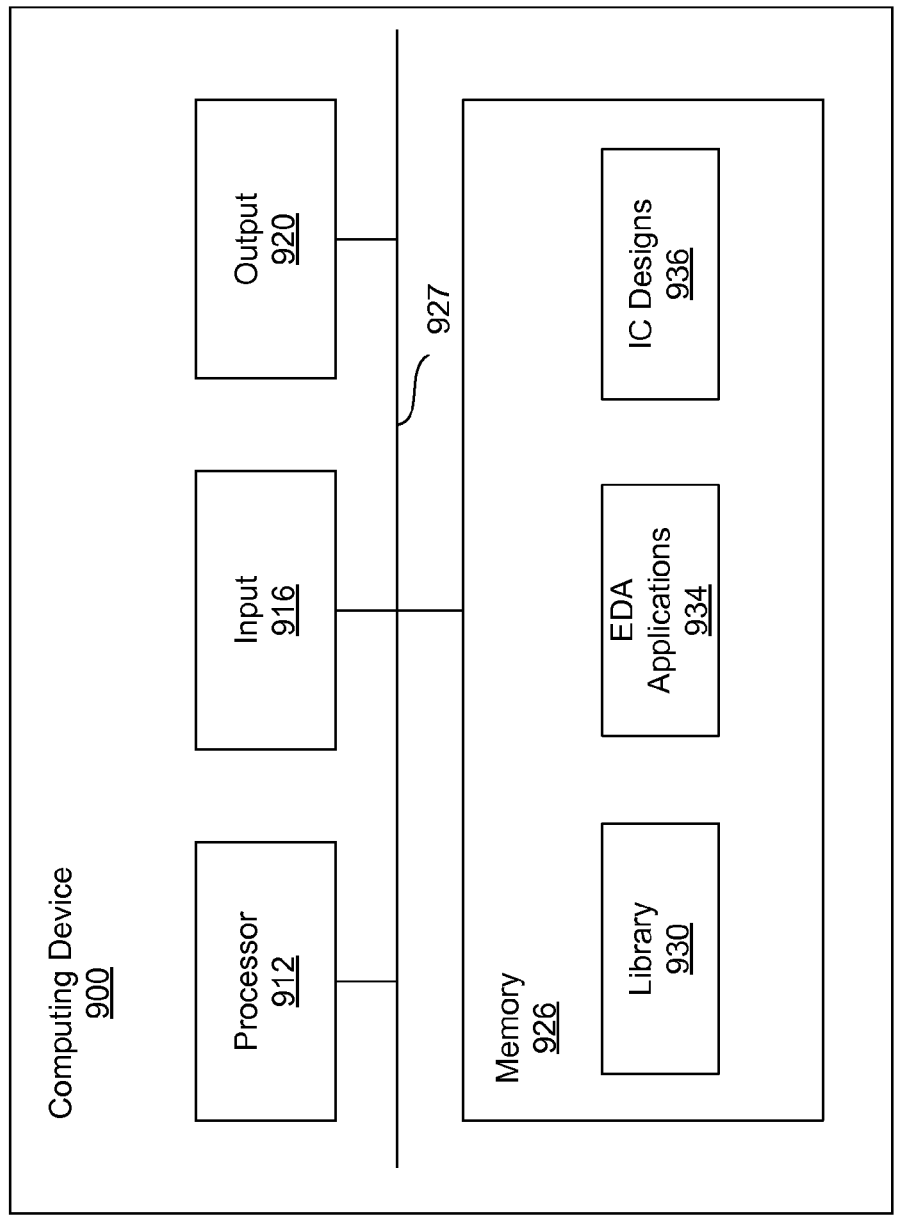

CIRCUIT FOR GENERATING NEGATIVE BITLINE VOLTAGE

CROSS-REFERENCE TO RELATED APPLICATIONS

This application claims priority under 35 U.S.C. §119(e) to U.S. Provisional Patent Application No. 61/798,055 entitled "Integrated Circuit for Generating a Negative Bitline Voltage and Integrated Memory Device Using the Same," filed on Mar. 15, 2013, which is incorporated by reference herein in its entirety.

BACKGROUND

1. Field of the Disclosure

The present disclosure relates to integrated memory devices and particularly to integrated memory devices having a data write assist scheme that provides a reliable data write access to the memory cells through a bitline.

2. Description of the Related Art

Integrated memory devices such as static random access memory devices (SRAMs) are subject to random variations due to Random Dopant Fluctuation (RDF), systematic and parametric variations when manufactured using subnanometer technologies. It is difficult to write data into the memory cells in cross corner locations due to such variations in the memory cell transistors. Such impacts may affect SRAMs manufactured using technologies having a 20 nanometer feature size and less.

For SRAMs in nanometer technologies, write assist concepts may be used to enhance the signal-to-noise margin when writing data into a static memory cell. One way of providing the write assist is to use a negative bitline scheme that applies a negative potential to a bitline when a corresponding data value is supplied by the bitline to a static memory cell. Conventional negative bitline schemes require considerable area and consume considerable power in the integrated circuit, and thus, are less suitable for low power applications. Furthermore, write assist schemes may be designed for a predetermined supply power range and are inflexible to accommodate varying supply power ranges.

SUMMARY

Embodiment relate to a circuit for outputting a negative voltage at an output using a plurality of capacitive elements. The circuit includes a switch, a plurality of capacitive elements and a driver. The switch is placed between an input node and a signal line. The switch selectively couples the signal line to the input node. Each of the plurality of capacitive elements has one end connected to the signal line to inject charge to the signal line for decreasing a voltage level of the signal line during a first mode responsive to decrease in a voltage level at another end of the capacitive element. The driver provides a driving signal to the other end of each of the plurality of capacitive elements in the first mode and to control the switch to couple or decouple the signal line and the input node.

In one embodiment, the circuit includes a driving element between an input of the circuit and the signal line. The driving element generates an output to the signal line that is an amplified version of a signal received at the input of the circuit.

In one embodiment, the circuit includes a plurality of delay elements, each element configured to inject the charge to the signal line at different times to gradually decrease the voltage level at the signal line.

In one embodiment, each of the plurality of delay elements includes two inverters coupled in series.

In one embodiment, a subset of the plurality of delay elements is turned off to decouple the capacitive elements from the driver.

In one embodiment, each of the plurality of capacitive elements includes a different number of capacitors configured to sequentially increase an amount of charge injected into the signal line.

In one embodiment, the circuit further includes a multiplexer coupling a plurality of bitlines of a memory cell to the signal line.

In one embodiment, the circuit is powered by coupling to a first reference voltage and a second reference voltage lower than the first reference voltage. The voltage level of the signal line drops below the second reference voltage responsive to injection of the charge and decoupling the signal line from the input node.

In one embodiment, each of the capacitor elements comprises $2^N$ capacitors where N is an integer larger than 0.

In one embodiment, the circuit further includes another switch and a plurality of switches. The other switch is placed between another input node and another signal line receiving a signal that is complementary to a signal received at the input node. The other switch selectively couples the other signal line to the other input node. A plurality of switches couple the one end of each capacitor element to the signal line and couple the one end of each capacitor to the driver in a second mode.

In one embodiment, each of the plurality of capacitors includes one or more MOS-capacitors.

BRIEF DESCRIPTION OF THE DRAWINGS

The teachings of the embodiments can be readily understood by considering the following detailed description in conjunction with the accompanying drawings.

FIG. 9 is a block diagram of a computing device for designing a circuit, according to one embodiment.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Figure 1:
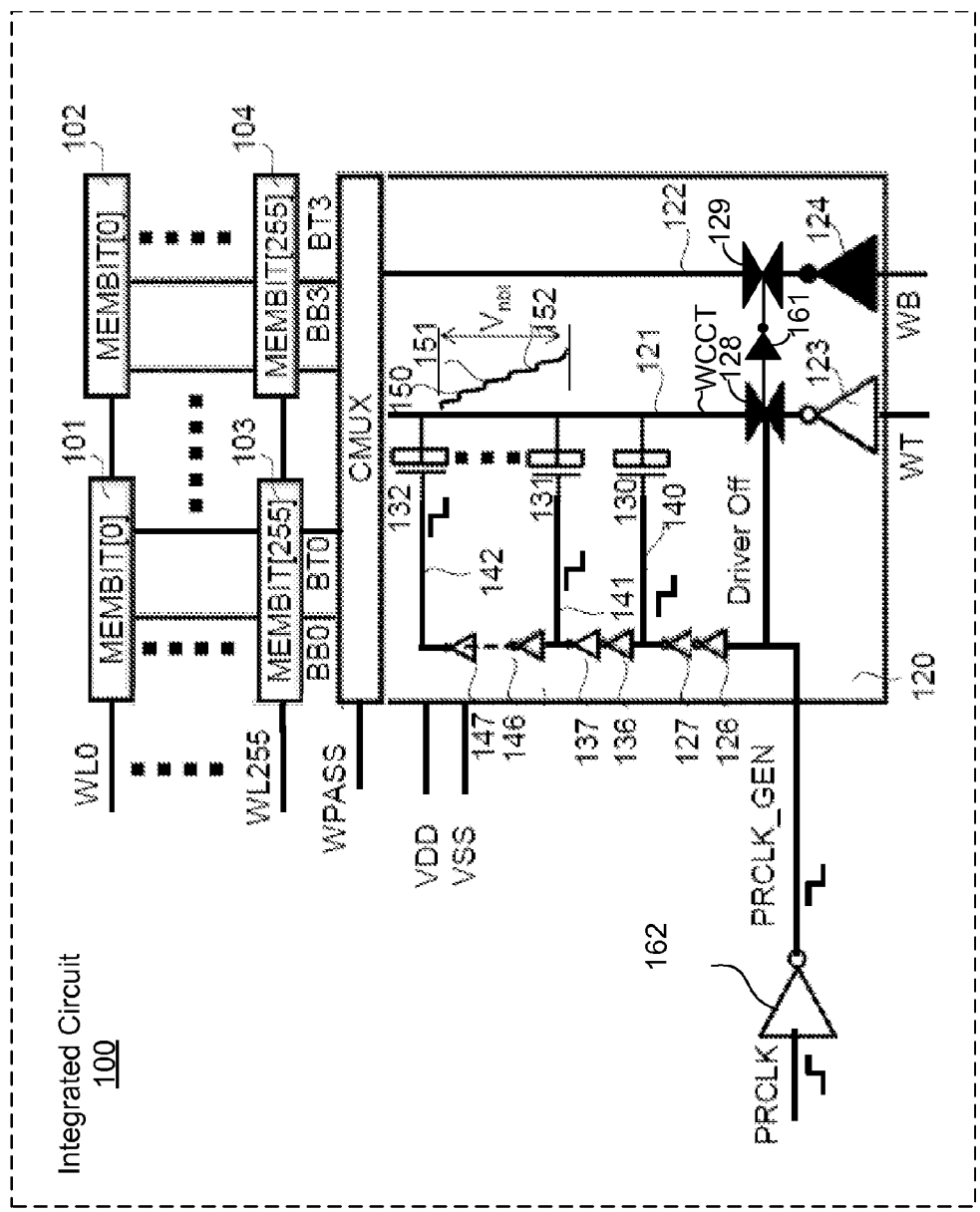
FIG. 1 is a circuit diagram of a write assist circuit, according to one embodiment.

FIG. 1 is a circuit diagram of an integrated circuit 100 according to one embodiment. The integrated circuit 100 may include a write assist circuit 120 and a memory cell array. The memory cell array may include bank of memory cells (example corner memory cells 101, 102, 103, 104 are illustrated in FIG. 1). The write assist circuit 120 generates a negative bitline voltage at one of its output using negative charge injection. The write assist circuit 120 is connected to bank of memory cells. During the write operation of one or more of the memory cells, the write assist circuit 120 provides voltage signals at its outputs BB0, BT0 through BB3, BT3. The output BB0 through BB3 from the complementary line may be pulled down to a negative voltage depending on data signal received at input WT of the write assist circuit 120.

The memory cells 101 through 104 are selectable through wordlines WL0 through WL255 that enable access to the memory cells in a wordline. An example of the memory cell is described below in detail with reference to FIG. 8. A data value is written into or read out of the memory cells through a pair of true and complementary bitlines, for example, bitlines BB0, BT0 for memory cells 101, 103 and BB3, BT3 for memory cells 102, 104.

During operation, the write assist circuit 120 writes a bit value of "0" or "1" into one of the memory cells corresponding to bit values received via the inputs WB, WT. The values "0" and "1" received at the inputs WB, WT are complementary, and only one of the inputs WB, WT have a voltage level corresponding to a logic value of "0" and the other of the inputs WB, WT has a voltage level corresponding to a logic value of "1". When the voltage at input WT is low, the output complementary outputs BT0 through BT3 are pulled down to a negative potential to assist writing correct data values to the memory bitcells.

The write assist circuit 120 may include, among other components, drivers 123, 124, signal lines 121, 122, pass gates 128, 129, inverters 126, 127, 136, 137, 146, 147 connected in series, capacitors 130, 131, 132, an inverter 161, and a column multiplexer CMUX. The driver 123 has an input WT connected to receive the bit value of "0" or "1" and the driver 124 has an input WB connected to receive a complementary bit value of "1" or "0" from an external circuit (not shown). The driver 124 has an output 124 that generates an amplified version of the voltage signal to CMUX corresponding to the voltage level at the input WT.

The signal lines 121, 122 may be precharged at the beginning of a write cycle. For example, the bitlines are pulled to a defined state so as to establish a voltage potential representing a "0" bit value on the signal line 121 and a voltage potential representing a "1" bit value on the signal line 122. The signal lines 121, 122 are connectable to the bitlines BB0, BT0, BB3, BT3 of the memory cell array through the column multiplexer CMUX. The outputs BB0, BT0 through BB3, BT3 of the write assist circuit 120 are connected to bitlines of the memory cells 101, 102, 103, 104 when a pass signal WPASS turns active. Conversely, the outputs BB0, BT0 through BB3, BT3 of the write assist circuit 120 are disconnected from bitlines of the memory cells 101, 102, 103, 104 when the pass signal WPASS turns inactive.

The write assist circuit generates a negative voltage Vnbl relative to the ground potential $V_{SS}$ when the voltage level at input WT is high. The multitude of capacitors 130, 131, 132 have one of their plates connected to the signal line 121 and the other plates connected to lines 140, 141, 142 extending from nodes between pairs of inverters 126, 127, 136, 137, 146, 147.

Figure 2:
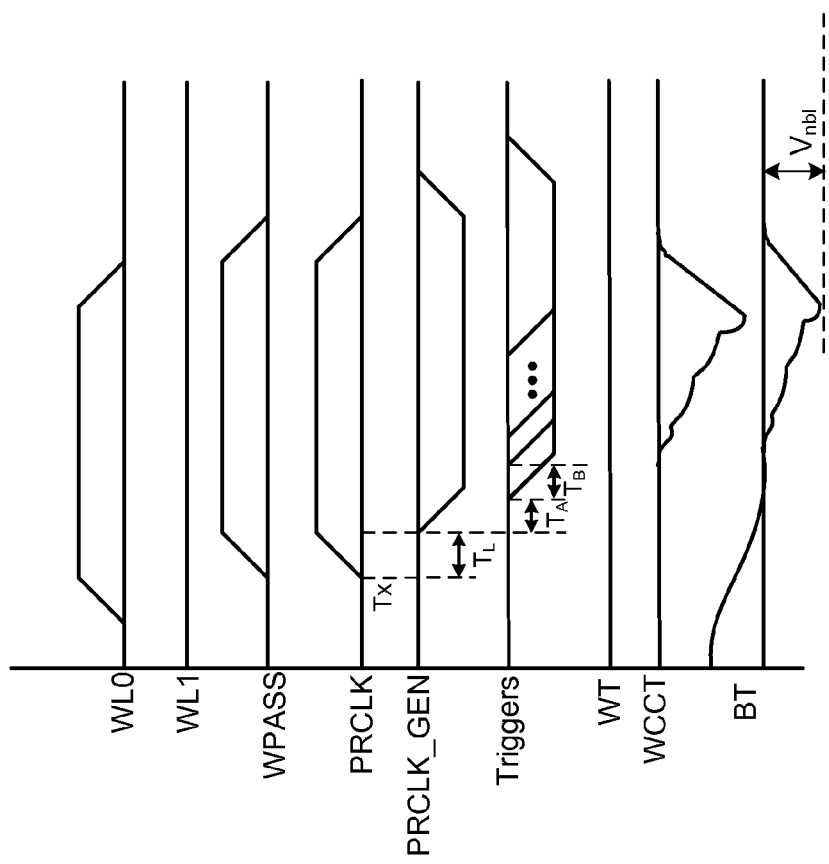
FIG. 2 is a waveform diagram of signals of the circuit of FIG. 1, according to one embodiment.

The write assist circuit 120 is connected to an output of a clock driver 162. The clock driver 162 receives a pre-charge clock signal PRCLK and generates a driving signal PRCLK_GEN. The driving signal PRCLK_GEN is used to operate pairs of inverters to sequentially apply the driving signal PRCLK_GEN to the capacitors 130, 131 and 132. Specifically, when a rising edge of signal PRCLK is received at the inverter 162, the inverter 162 generates a falling edge in the driving signal PRCLK_GEN after a time delay of $T_L$ as illustrated in FIG. 2. The falling edge of the driving signal PRCLK_GEN is fed to a pair of inverters 126, 127 connected in series. In response to receiving the falling edge of the driving signal PRCLF_GEN, the inverter 127 outputs a falling edge trigger signal to line 140 after a time delay $T_A$. The output from the inverter 127 is also fed to a next pair of inverters 136, 137. In response, the inverter 137 outputs a falling edge trigger signal to line 141 after a time delay $T_B$. The subsequent pairs of inventers are driven to generate falling edge trigger signals to lines (e.g., line 142) connected to one plate of the capacitors. By driving pairs of inverters sequentially, the driver 162 is not subject to abrupt load, and hence, does not suffer overload.

The driving signal PRCLK_GEN also functions as Driver Off signal that turns off the pass gate 128, and thereby, decouples the driver 123 from signal line 121. When PRCLK_GEN turns inactive, the driver 123 is decoupled from the signal line 121 by the pass gate 128. By decoupling the line 121 from the driver 123, the voltage level of line 121 can be gradually dropped to −Vnbl which is below ground voltage $V_{SS}$. That is, as the levels of voltages sequentially drop in lines 140, 141, 142, capacitances 130, 131, 132 cause the voltage level in the signal line 121 to drop sequentially as shown by lines 150, 151, 152, finally reaching negative voltage bitline potential −Vnbl.

The inverter 161 inverts Driver Off signal and provides the inverted signal to the pass gate 129. The inverted signal turns on pass gate 129 when pass gate 128 is turned off and vice versa. Hence, only one of the signal lines 121, 122 is at one time connected to the drivers 123, 124.

The driver 124 receives a signal at input WB and outputs an amplified version of the received signal to signal line 122. The signal sent to the line 122 is the inverted version of the signal received at the input WB. Contrary to the voltage level at the signal line 121, the voltage level in the signal line 122 does not drop below ground voltage $V_{SS}$.

FIG. 2 shows waveforms of signals of the circuit of FIG. 1, according to one embodiment. In the example of FIG. 2, the first wordline signal WL0 is turned active while wordline signal WL1 remains inactive to write data to the first row of memory cells. WPASS signal turns active to enable multiplexer CMUX to couple lines 121, 122 to outputs BB0, BT0 through BB3, BT3. Also, the rising edge of clock signal PRCLK starts at time Tx and the falling of the driving signal PRCLK_GEN follows after a delay of time $T_L$. The falling edges of the trigger signals are transmitted via lines 140, 141, 142 after certain delays (e.g., $T_A$ or $T_A+T_B$) from the time the driving signal PRCLK_GEN starts to drop.

As a consequence, the first capacitor 130 injects negative charge to the signal line 121 which was previously on zero potential or ground potential Vss. The charge injected by capacitor 130 decreases the potential in the signal line 121 slightly below zero potential or ground potential Vss. The next falling edge on line 141 injects charge from capacitor 131 to the signal line 121 previously in a slightly negative potential 150 to a lower potential 151. The injection of charge from the capacitors continues until the last occurring falling edge on line 142 injects the charge stored in capacitor 132 onto the signal line 121 and results in a final negative voltage −Vnbl. While the multiplexer CMUX connects the signal line 121 to one of the output BT and then to bitlines of the memory cell array when pass signal WPASS is active. The bitline 121 is shared by the multiplexer CMUX with more than one bitlines of the memory cell array.

In the example of FIG. 2, the voltage at input WT is at "0" logic level while input WT is at "1" logic level (not shown). The voltage signal at input WT is inverted by the driver 123. As the pass gate 128 is turned off, voltage WCCT in line 121 drops below zero potential or ground potential Vss by the negative charge injection of the capacitors 130, 131, 132. As the multiplexer CMUX couples the signal line 121 to the output BB0 through BB3, a voltage waveform indicated as "BT" is provided at the output BB0 through BB3

In one embodiment, the memory cells are supplied with an external power supply having potential $V_{DD}$ and ground potential $V_{SS}$. A suitable external supply voltage may be in the range of between 0.5 V to 1.2 V for $V_{DD}$ and $V_{SS}$ being ground potential, 0 V. The memory circuit may be supplied with a voltage $V_{DD}$ between 0.63 V to 1.14 V using the disclosed negative voltage bitline scheme to provide write assist capability. Simulations even showed that no write failure occurs at a supply voltage of as low as 0.53 V.

As the write assist circuit 120 of FIG. 1 includes a multitude of capacitors, it is possible to tightly control the level of negative bitline voltage Vnbl. Compared to conventional write assist circuits using one single large capacitor for a negative bitline scheme, embodiments described herein uses a plurality of smaller capacitors and generates the negative bitline voltage in multiple phases by triggering charge injection of multiple capacitors. During the design of the circuit, the number of capacitors can be adjusted to the desired operating voltage $V_{DD}$ so as to achieve a predetermined level of negative bitline voltage Vnbl. Specifically, one or more pairs of inverters 126, 127, 136, 137, 146, 147 may be made inoperable during the design of the write assist circuit to tune the negative bitline voltage Vnbl. Alternatively, a number of lines 140, 141, 142 to the capacitor may be disconnected to tune the negative bitline voltage Vnbl. If the memory cells are targeted for a relatively low supply voltage $V_{DD}$, the negative bitline voltage Vnbl may be set to a small value (i.e., voltage Vnbl closer to ground potential $V_{SS}$=0 V). Accordingly, during the design of the memory chip, the chip designer can program the number of capacitors to be used to adjust a suitable range of negative bitline voltage Vnbl adapted to an intended range of supply voltage $V_{DD}$. Also, unnecessary capacitors may not even be provided on the chip layout. Furthermore, if the range of supply voltage $V_{DD}$ is unknown to the chip designer, the suitable number of capacitors to inject charge may be soft programmed by turning on or off the pairs of the inverters 126, 127, 136, 137, 146, 147 to achieve the suitable Vnbl for the actual $V_{DD}$.

The capacitors 130, 131, 132 are implemented as small capacitors that are available in the manufacturing technology of the integrated memory circuit. It is useful to implement the capacitors 130, 131, 132 as MOS capacitors (MOSCAPs). The elements of the circuit are basic and easy to manufacture MOSCAPs, inverter chains and pass gate switches and the circuit is easily controlled by sequential operation. Specifically, the present circuit avoids complex charge pump solutions as used in conventional write assist schemes and replaces conventional circuits by MOSCAP, inverters and pass gate switches. By the sequential and multi phase operation, a relatively low charge portion is injected on the bitline so that the desired negative bitline voltage is controllably achieved in dependence on the operational environment of the memory device. For example, power can be saved by switching off some or all of the inverters. The inverters and all other circuits are supplied by the normal power supply of the other circuits of the memory device. For example, the inverters and capacitors and all the switches are supplied by the $V_{DD}$ potential and the ground potential $V_{SS}$.

Furthermore, depending on the expected external supply voltage $V_{DD}$, the number of capacitors to be used for the charge injection can be hard or soft programmed to achieve a suitable negative voltage bitline level. If the supply voltage is high (e.g., 1.0 V or higher), it is useful to reduce the negative bitline voltage closer to 0 V or even operate without negative bitline voltage because access transistors of the unselected memory cells in the memory cell array cannot be turned off if the negative bitline voltage is too low. On the other hand, if the supply voltage $V_{DD}$ is low (e.g., in the range of 0.6 V or even 0.5 V), it is advantageous to set the negative bitline voltage sufficiently low so that the access transistors of the selected memory cell can sufficiently transmit the desired information value for writing into the memory cell. Hence, the write assist circuit according to embodiments improves the signal-to-noise margin of unselected cells and avoids half selected cells that results in an unstable condition. As the number of capacitors to be used is programmable, unnecessary parasitic capacitance on the bitlines during a read operation can also be avoided.

While conventional solutions may use a single large capacitor, the present embodiments use multiple smaller capacitors that may be MOSCAPs that generate the negative bitline voltage in a multiple phase approach. Hence, larger levels of negative bitline voltage can be achieved while tightly controlling the level of the negative bitline voltage Vnbl. The disclosed embodiments may be placed in a read/write input-output (R/W-IO) area of the integrated memory chip so that area saving can be achieved along the muxes and the memory banks. In the embodiment, the area used is 8u height for the whole implementation. The circuit can be shared between at least two memory banks. In particular, the circuit can be shared between the columns of the same I/O and the upper and the lower bank.

Figure 3:
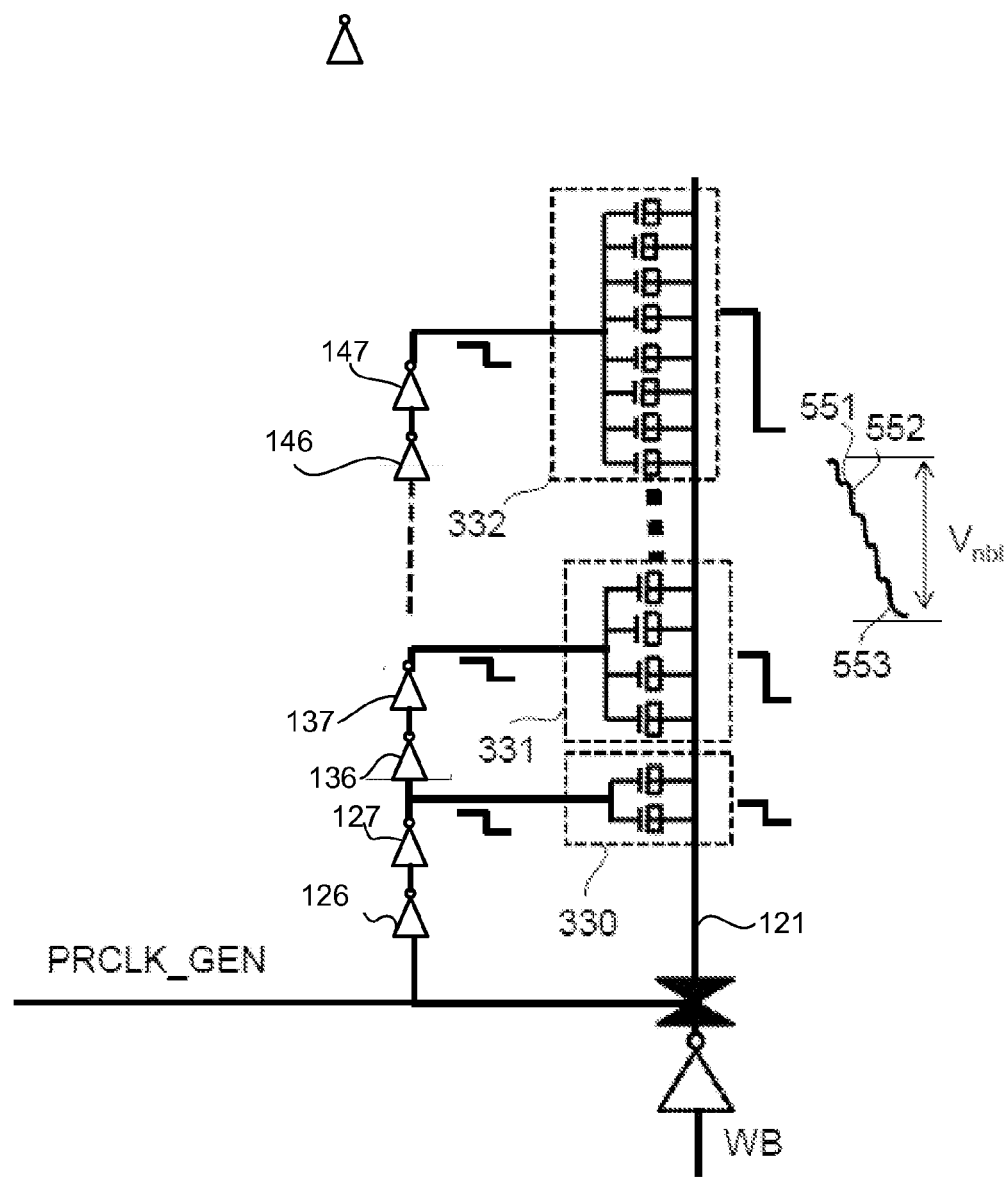
FIG. 3 is a circuit diagram of a write assist circuit, according to another embodiment.

FIG. 3 is a partial circuit diagram of a write assist circuit, according to another embodiment. The embodiment of FIG. 3 is similar to the embodiment of FIG. 1 except that the write assist circuit of FIG. 3 includes groups of capacitors 330, 331, 332 coupled to the outputs of the inverters 127, 137, 147 while the circuit in FIG. 1 includes groups of capacitors that have one single capacitor in each group. In FIG. 3, the capacitors in each group are connected in parallel to each other. Furthermore, the group of capacitors 331 has more capacitors than the group of capacitors 330, and the group of capacitors 332 has more capacitors than the group of capacitors 331 and 330. Specifically, a group of capacitors subsequently injecting the negative charge has more capacitors in its group than a group of capacitors injecting the negative charge at earlier times. All capacitors may have substantially the same capacitance or the same charge storage size and may be formed of MOSCAPs.

In operation, the group of capacitors 330 receives the first falling edge of a signal output from the inverter 127, and in response, injects a relatively small amount of negative charge 551 to signal line 121. The subsequently operated group of capacitors 331 has more capacitors in its group so that the negative voltage jump 552 injected on the bitline is larger than the previous voltage jump 551. Finally, the last negative voltage jump 553 on the bitline caused by a group of capacitors 332 in response to the falling edge of the output from inverter 147 causes the largest negative voltage jump on the bitline. Accordingly, the negative voltage jump in the signal line 121 caused by a subsequent group of capacitors is larger than the negative voltage jump in the signal line 121 caused by a prior group of capacitors. This is achieved by including more capacitors in the subsequent groups of capacitors. In the embodiment, one group of capacitors has double the number of the capacitors in the immediate prior group of capacitors. For example, the group of capacitors 330 has two inverters, the group of capacitors 331 has four inverters, and the group of capacitors 332 has eight inverters. Different groups of capacitors may have $2^N$ capacitors, wherein N is the serial number of the group of capacitors.

Figure 4:
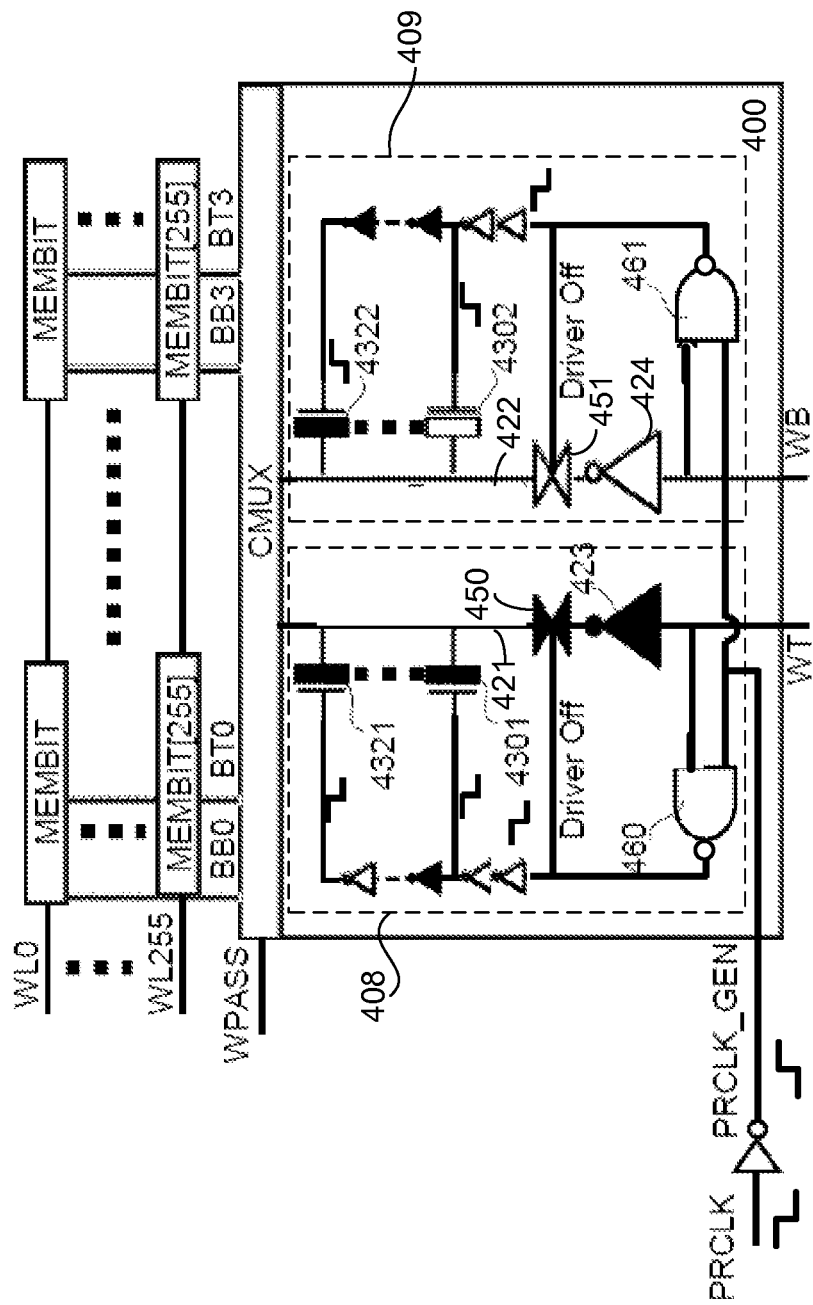
FIG. 4 is a circuit diagram of a write assist circuit using a charge injection scheme on a true and a complementary bitline, according to one embodiment.

FIG. 4 is a circuit diagram of a write assist circuit 400 using a charge injection scheme on both signal lines, according to one embodiment. The write assist circuit 400 expands the negative voltage bitline write assist scheme to a pair of signal lines 421, 422. Depending on the bit value to be written into memory cells of the memory cell array, either the true signal 421 or the complementary signal line 422 is charged to a negative bitline voltage Vnbl. The capacitors 4301, 4321 correspond to the capacitors 130 and 132 of FIG. 1 and are connected to the signal line 421. A driver-off signal decouples the driver 423 from the signal line 421 when the signal line 421 is to be charged to a negative bitline voltage. In addition, capacitors 4301, 4321, 4302, 4322 illustrated in FIG. 4 represent groups of capacitors of at least one or more or $2^N$ capacitors (where N is an integer of 1 or larger), as described above in detail with reference to FIG. 3. The capacitors are controlled by a sequence of delayed falling edge step signals.

A portion 408 of the write assist circuit generating the negative voltage for the true signal line 421 mirrors or is substantially identical to a portion 409 of the write assist circuit generating the negative voltage for the complementary signal line 422. The write assist circuit 400 includes a switching mechanism that switches either one of the two signal lines 421, 422 but not both. The switching mechanism may include two NAND gates 460, 461 that receive the driving signal PRCLK_GEN and a voltage signal from an input node WT or WB. NAND gate 460 receives the driving signal PRCLK_GEN and a signal bit received at input node WT. NAND gate 461 receives the driving signal PRCLK_GEN and a signal bit received at input node WB.

Assuming that the input signal at input node WT turns active, the input signal at WB turns inactive. When the driving signal PRCLK_GEN turns active, the output from NAND gate 460 output drops. Such drop in the output of NAND gate 460 causes pass gate 450 to turn off, decoupling signal line 421 from the output of the driver 423. The drop in the output of NAND gate 460 also causes the capacitors 4301, 4321 to sequentially inject negative charge to the signal line 421. On the other hand, the inactive signal at input node WB causes the output from NAND gate 461 to turn active. Hence, the pass gates 451 is turned on to couple the signal line 422 to the drivers 424. When the input signal at input node WT turns inactive, the input signal at WB turns active, NAND gate 461 causes the pass gate 451 to turn off the capacitors 4302, 4322 to sequentially inject negative charge to the signal line 422 while coupling the signal line 421 to the driver 423 by the pass gate 450. Accordingly, only one of the signal lines 421 and 422 is pulled down to a negative bitline voltage whereas the other of the signal lines 421 and 422 is set to a high voltage level.

When PRCLK_GEN is inactive, the outputs from NAND gates 460, 461 both turn active and cause the drivers 423, 424 to couple to the signal lines 421, 422.

Figure 5:
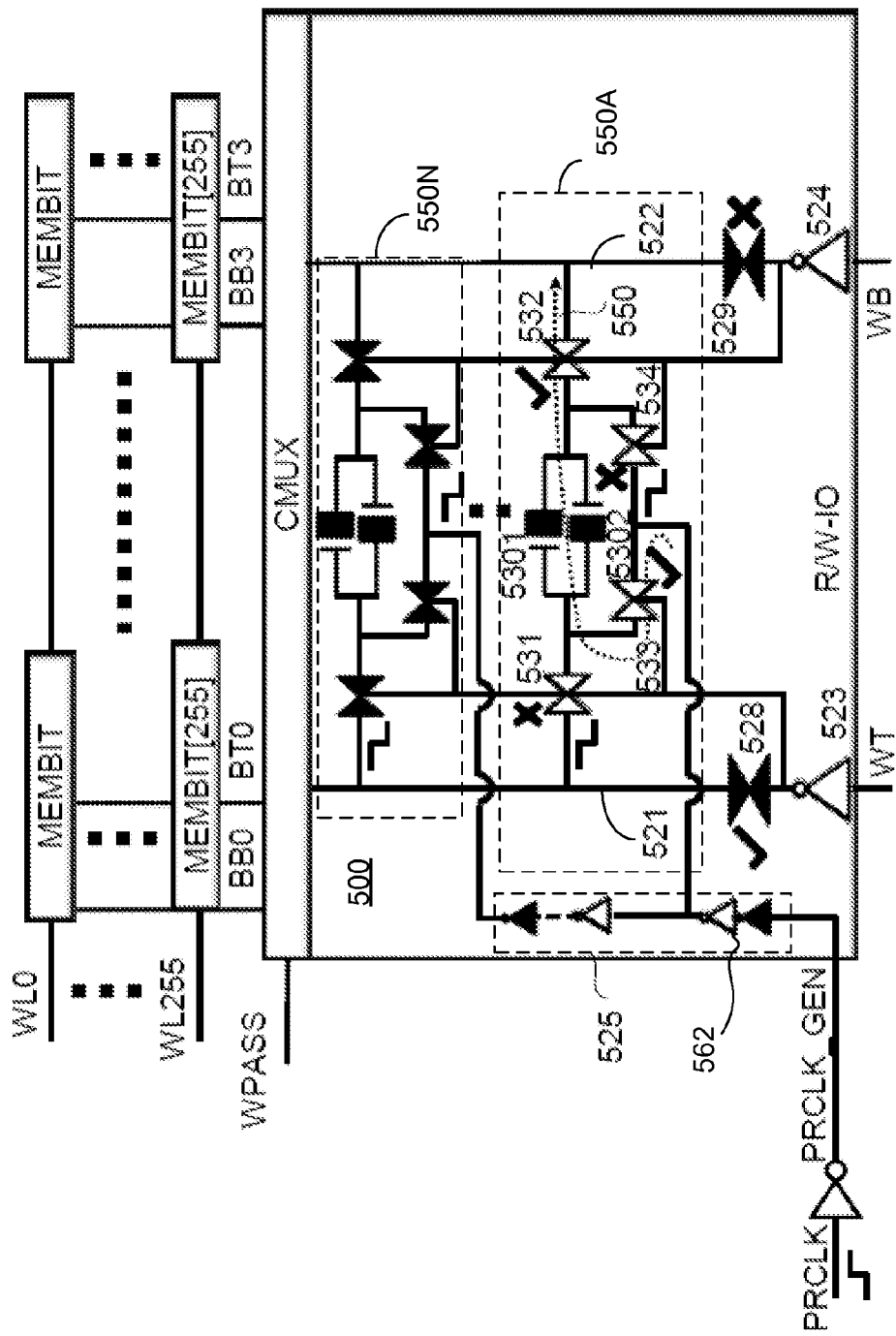
FIG. 5 is a circuit diagram of a write assist circuit having capacitors shared between a true bitline and a complementary bitline in one mode, according to one embodiment.

FIG. 5 is a circuit diagram of a write assist circuit 500 having capacitors shared between signal lines 521, 522 in one mode, according to one embodiment. The write assist circuit 500 includes a plurality of sub-circuits 550A through 550N, each injecting certain amount of negative charge to either the signal line 521 or the signal line 522 depending on the logic signal received at input nodes WT, WB. The first sub-circuit 550A is provided with an output from a first pair of inverters 562 to cause capacitors 5301, 5302 to inject negative charge to the signal line 521 or the signal line 522. A second sub-circuit 550B (not shown) is provided with an output from a second pair of inverters (not shown) receiving the output from the first set of inverters 562. The second pair of inverters generates an output which is delayed relative to the output of the first set of inverters 562 and causes capacitors in the second sub-circuit 550B to inject negative charge to the signal line 521 or the signal line 522. Each pair of inverters of the inverter chain 525 provides output to a corresponding sub-circuit 550 to gradually drop the voltage level in the signal line 521 or the signal line 522.

The sub-circuit 550A may include, among other components, pass gates 531, 532, 533, 534 to apply the output (i.e., a signal with a falling edge) from the first pair of inverters 562 to one side of the shared capacitors 5301, 5302. Capacitors 5301 and 5302 may be connected in an antiparallel fashion to the signal lines 521, 522. In one embodiment, the capacitors are connected antiparallel so that a bulk contact of a MOSCAP is connected to the gate contact of the other MOSCAP and the bulk contact of the other MOSCAP is connected to the gate contact of the MOSCAP. Pass gates 531, 532 are connected between the antiparallel connection of the group of capacitors 5301, 5302 and the signal lines 521, 522. The output from the first pair of inverters 562 passes through pass gate 533 to plates of the capacitors 5301, 5302. A control input of each of the pass gate 533, 534 is coupled to either the signal line 521 or the signal line 522.

The pass gates 531, 532 operate in a complementary manner. That is, the pass gate 532 is turned off when pass gate 531 is turned on, and vice versa. The pass gates 534, 533 may also operate in a complementary manner. That is, the pass gate 534 is turned on when the pass gate 533 is turned off, and vice versa. The pass gates 531, 532, 533, 534 cause the capacitors 5301, 5302 to inject negative charges to either the signal line 522 or the signal line 531, in response to receiving a falling edge of the output from the first set of inverters 562.

In FIG. 5, the operation of the sub-circuit 550A is shown when a logic signal of "0" is received at input node WT and a logic signal of "1" is received at input node WB. A driver 523 inverts the logic value "0" at input node WT and outputs the inverted version of the voltage at input node WT via a pass gate 528 to a signal line 521. On the other hand, the output of driver 524 is decoupled from the signal line 522 by pass gate 529. Hence, the voltage level of the signal line 522 can be dropped below the ground potential despite the presence of the driver 524.

As shown in FIG. 5, the signal line 522 is to be charged to a negative bitline voltage Vnbl. Accordingly, the driver 524 is decoupled from complementary bitline 522 by switched off pass gate 529, as shown by "X". The driver 523 is connected to the signal line 521 as shown with "✓". The switching state of pass gates 531, 532, 533, 534 is shown as "X" (switched off) and as "✓" (switched on). The traveling path of the falling edge step signal is shown by dotted line 550. A similar consecutive operation occurs in other sub-circuits 550B through 550N so as to generate a sequence of negative voltage jumps on signal lines 521 or 522.

Figure 6:
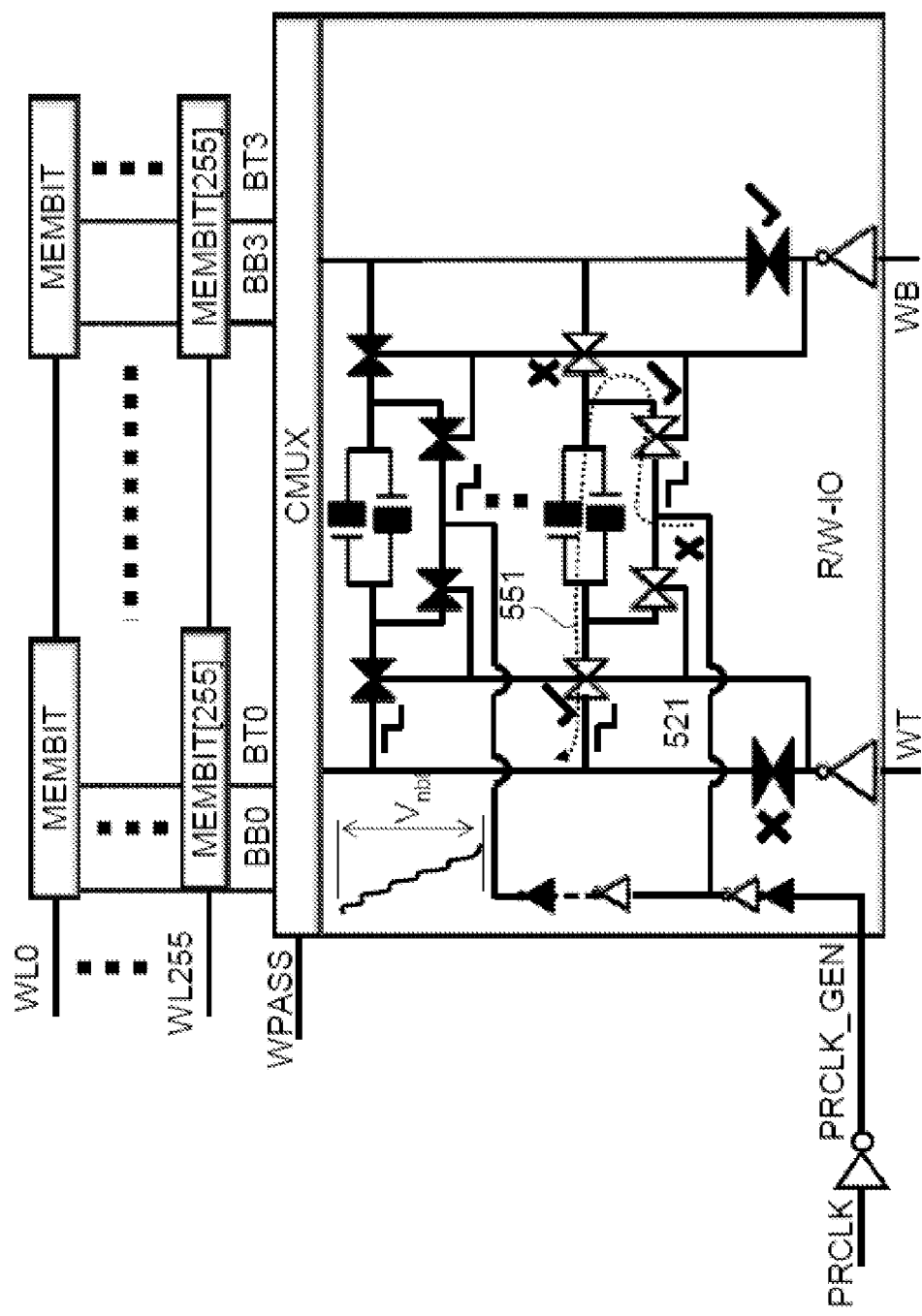
FIG. 6 illustrates the circuit of FIG. 5 in another mode, according to one embodiment.

FIG. 6 shows the same circuit of FIG. 5 when signal line 521 is to be injected with negative charge in another mode, according to one embodiment. In this case, the output from the first pair of inverters 562 travels through the path depicted by dotted line 551 with pass gates 528, 529, 531, 532, 533, 534 turned on or off as shown by "✓" (switched on) and "X" (switched off). As a result, the potential of the signal line 521 drops below the ground potential by Vnbl.

Figure 7:
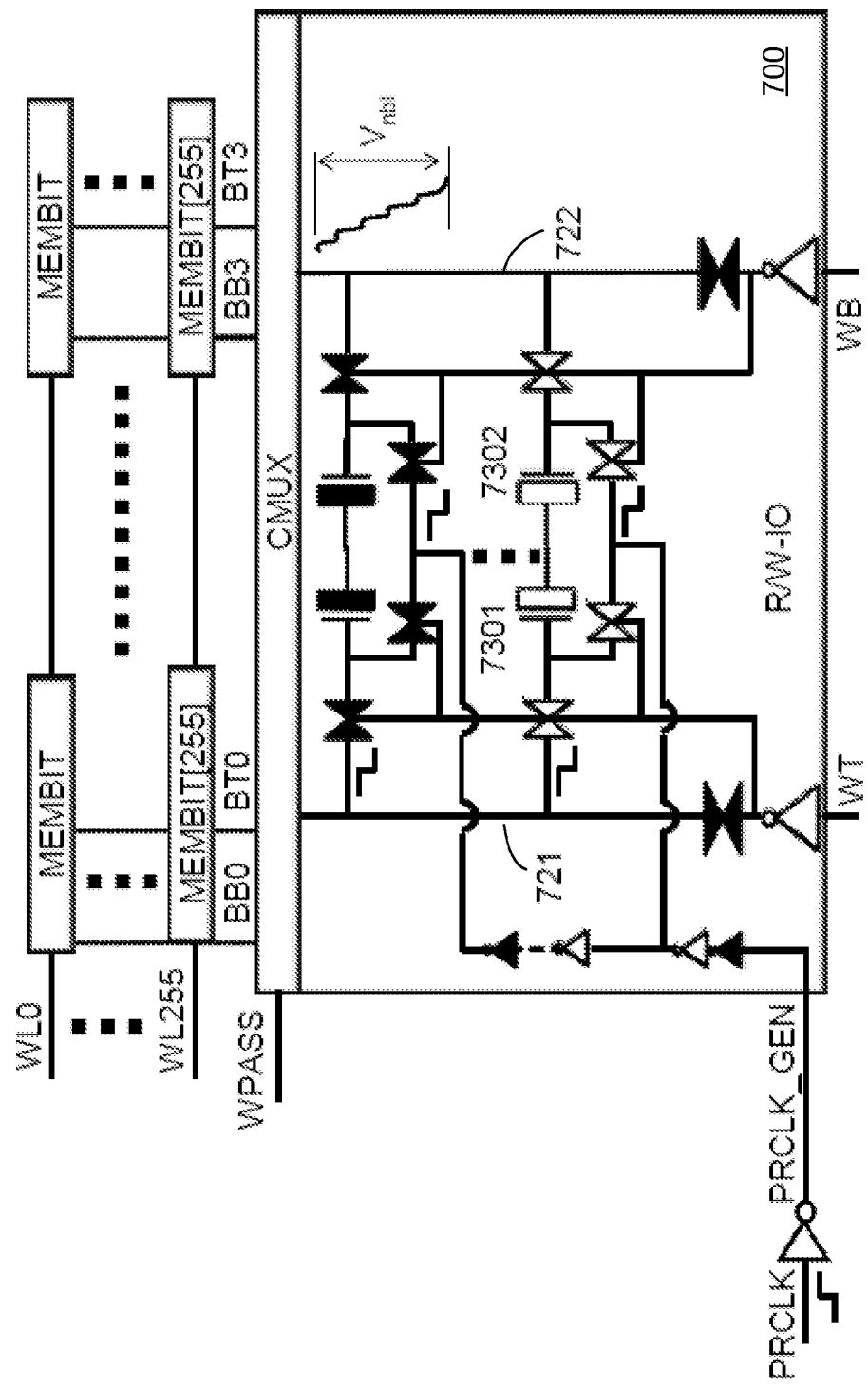
FIG. 7 is a circuit diagram of a write assist circuit having capacitors shared between the two signal lines, according to another embodiment.

FIG. 7 is a circuit diagram of a write assist circuit 700 having capacitors shared between the two signal lines 721, 722, according to another embodiment. The structure and operation of the write assist circuit 700 is substantially the same as the write assist circuit 500 of FIG. 5 except that capacitors 7301, 7302 include a group of capacitors connected in series instead of being connected in an antiparallel manner. The series connection of capacitors 7301, 7302 is connected between the signal line 721 and signal line 722.

Figure 8:
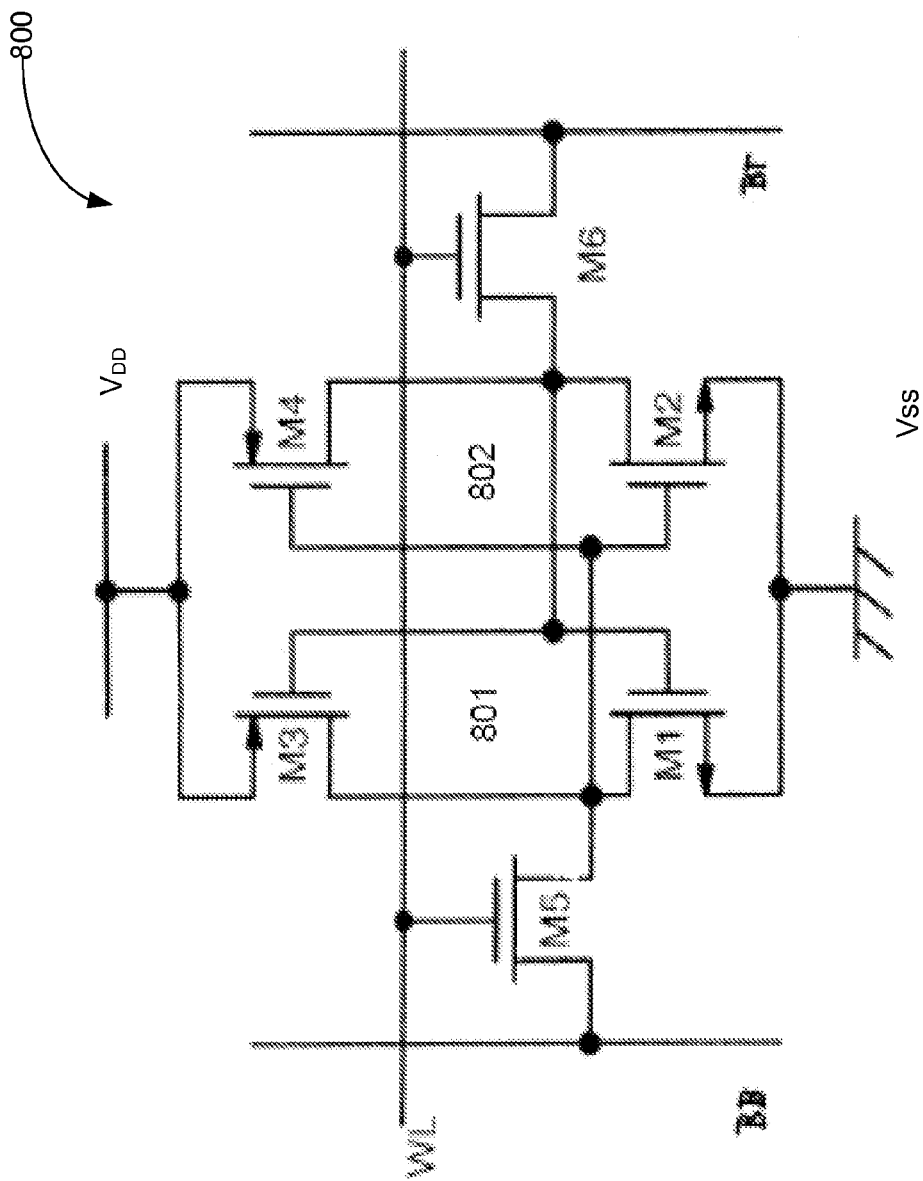
FIG. 8 is a six transistor static memory cell suitable for using the write assist circuit, according to one embodiment.

FIG. 8 is a circuit diagram of a six transistor static memory cell 800 suitable for using the write assist circuit, according to one embodiment. Each of memory cells 101, 102, 103, 104 may be implemented as the static memory cell 800 illustrated in FIG. 8. The static memory cell 800 may include, among other components, two cross-coupled inverters 801, 802 connected between the supply voltage $V_{DD}$, $V_{SS}$. The outputs of the cross-coupled inverters 801, 802 are connected to complementary bitline BB and the true bitline BT through transistors M5, M6, respectively. The access transistors M5, M6 are connected both to a wordline WL. All transistors M1 through M6 of the static memory cell of FIG. 8 may be conventional MOS transistors having a planar gate.

The negative bitline voltage applied, for example, to the true bitline BT pulls the source of the access transistor M6 lower than the ground voltage $V_{SS}$ so that access transistor M6 is fully on when an "0" information bit is to be written into the memory cell. On the other hand, true bitline BT is not pulled down to an excessively negative voltage relative to ground potential $V_{SS}$ when the static memory cell 800 is not selected for the writing operation (i.e., when the voltage at the wordline WL is low). When the static memory cell 800 is not selected, it is advantageous to prevent the negative bitline voltage from becoming excessively low so that the access transistors M5, M6 do not become unstable.

In one embodiment, capacitors of the negative bitline voltage circuit scheme, like capacitors are embodied as MOSCAPs derived from switching transistors like transistors M1 through M6. Alternatively, the transistors of a memory cell may be FinFET transistors that include three-dimensional configuration having the active area on top of a substrate. Such transistors may be multi-gate transistors enabling high-charge storing capacity at a relatively low chip area. By using FinFET capacitors instead of MOSCAPs in the negative bitline voltage circuits as shown in any of the FIGS. 1 to 7, the efficiency of the negative voltage bitline generating circuit can be enhanced and chip area usage can be reduced.

FIG. 9 is a block diagram of a computing device 900 for performing designing operations associated with integrated circuit. The computer device 900 may include, among other components, a processor 912, an input module 916, an output module 920, a memory 926 and a bus for connecting these components. The processor 912 executes instructions stored in the memory 926. The input module 916 may include various devices for receiving user input, including keyboards and pointing devices (e.g., mouse and touch screen). The output module 920 includes a display device or interface device for communicating with the display device.

The memory 926 is a non-transitory computer readable storage medium storing, among others, library 930, electronic design automation (EDA) applications 934 and integrated circuit (IC) designs 936. The library 930 may include data on various circuit components, including instances of write assist circuits describe herein. The EDA applications 934 may include various software programs for designing ICs, including place and route tools, synthesis tools, and verification tools. The design processed by the EDA applications 934 may be stored in IC designs 936. The IC designs 936 may be an entire operational circuit or a part of a larger IC circuit.

In one embodiment, the negative bitline voltage limit can be restricted by an auto-cutoff switch. Such restriction ensures that the signal-to-noise margin of the memory cells is maintained.

In one embodiment, power saving can be also be achieved by switching off a subset of inverters in the inverter chain. An external circuit may be provided to switch on or off the inverters in the inverter chain.

In one embodiment, the write assist circuit is shared between various columns or between different memory banks.

Although embodiments are described herein with reference to generating the negative bitline voltage for the writing operation of a static memory device. That is, the negative bitline voltage may be used for other operations of the static memory device. Further, the negative voltage may be used for other non-memory applications.

The disclosed write assist scheme is useful to generate a negative bitline voltage on a corresponding I/O bitline that can be shared between memory banks. While the additional circuits for the negative bitline scheme are on the I/O bitline level, the area impact may be very small. Further, a gradual charge injection is performed to lower the voltage at a bitline, and hence, the power consumption associated with the generation of the negative bitline voltage can be reduced. It is also possible to soft program the level of negative bitline voltage depending on the level of the external power supply.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A circuit, comprising:
a switch between an input node and a signal line, the switch selectively coupling the signal line to the input node;
a plurality of capacitive elements, each of the plurality of capacitive elements having one end connected to the signal line to inject charge to the signal line for decreasing a voltage level of the signal line during a first mode responsive to decrease in a voltage level at another end of the capacitive element; and
a driver configured to provide a driving signal to the other end of each of the plurality of capacitive elements in the first mode and to control the switch to couple or decouple the signal line and the input node.

2. The circuit of claim 1, further comprising a driving element between an input of the circuit and the signal line, the driving element generating an output to the signal line that is an amplified version of a signal received at the input of the circuit.

3. The circuit of claim 1, further comprising a plurality of delay elements, each element configured to inject the charge to the signal line at different times to gradually decrease the voltage level at the signal line.

4. The circuit of claim 3, wherein each of the plurality of delay elements include two inverters coupled in series.

5. The circuit of claim 3, wherein a subset of the plurality of delay elements is turned off to decouple the capacitive elements from the driver.

6. The circuit of claim 3, wherein each of the plurality of capacitive elements include a different number of capacitors configured to sequentially increase an amount of charge injected into the signal line.

7. The circuit of claim 1, further comprising a multiplexer coupling a plurality of bitlines of a memory cell to the signal line.

8. The circuit of claim 1, wherein the circuit is powered by coupling to a first reference voltage and a second reference voltage lower than the first reference voltage, a voltage level of the signal line dropping below the second reference voltage responsive to injection of the charge and decoupling of the signal line from the input node.

9. The circuit of claim 8, wherein each of the capacitor elements comprises $2^N$ capacitors where N is an integer larger than 0.

10. The circuit of claim 1, further comprising
another switch between another input node and another signal line receiving a signal that is complementary to a signal received at the input node, the other switch selectively coupling the other signal line to the other input node; and
a plurality of switches configured to couple the one end of each capacitor element to the signal line and couple the one end of each capacitor to the driver in a second mode.

11. The circuit of claim 1, wherein each of the plurality of capacitors comprise one or more MOS-capacitors.

12. A method of providing a negative voltage signal, comprising:
coupling a signal line to an input node;
receiving a driving signal at one end of each of the plurality of capacitive elements in the first mode;
decoupling the signal line from the input node in a first mode by a switch responsive to detecting transition in the driving signal; and
injecting charge to the signal line by another end of each of the plurality of capacitive elements in the first mode responsive to decoupling the signal line from the input node and decrease of a voltage level at the one end of each of the plurality of capacitive elements.

13. The method of claim 12, further comprising generating an output to the signal line that is an amplified version of a signal received at the input node.

14. The method of claim 12, further comprising delaying the driving signal by different time delays by a plurality of delay elements to cause the other end of each of the plurality of capacitive elements to inject the charge to the signal line at different times.

15. The method of claim 14, further comprising turning off one or more delay elements to decouple one or more of the plurality of capacitive elements.

16. The method of claim 12, wherein each of the plurality of capacitive elements include a different number of capacitors configured to sequentially increase an amount of charge injected into the signal line.

17. The method of claim 12, further comprising coupling a plurality of bitlines of a memory cell to the signal line by a multiplexer.

18. The method of claim 12, further comprising coupling to a first reference voltage and a second reference voltage lower than the first reference voltage, and wherein a voltage level of the signal line drops below the second reference voltage responsive to injection of the charge and decoupling of the signal line from the input node.

19. The method of claim 12, further comprising:
coupling another signal line to another input node receiving a signal that is complementary to a signal received at the input node;
receiving a driving signal at the other end of each of the plurality of capacitive elements in a second mode;
decoupling the signal line from the other input node in the first mode by a switch responsive to detecting transition in the driving signal; and
injecting charge to the signal line by the one end of each of the plurality of capacitive elements in the second mode responsive to decoupling the signal line from the input node and decrease of a voltage level at the one other end of each of the plurality of capacitive elements.

20. A non-transitory computer readable storage medium storing a design of a circuit, the circuit comprising:
a switch between an input node and a signal line, the switch selectively coupling the signal line to the input node;
a plurality of capacitive elements, each of the plurality of capacitive elements having one end connected to the signal line to inject charge to the signal line for decreasing a voltage level of the signal line during a first mode responsive to decrease in a voltage level at another end of the capacitive element; and
a driver configured to provide a driving signal to the other end of each of the plurality of capacitive elements in the first mode and to control the switch to couple or decouple the signal line and the input node.

* * * * *